United States Patent [19]
Straboni et al.

[11] Patent Number: 5,229,318
[45] Date of Patent: Jul. 20, 1993

[54] PROCESS FOR BURIED LOCALIZED OXIDATION OF A SILICON SUBSTRATE AND CORRESPONDING INTEGRATED CIRCUIT

[75] Inventors: Alain Straboni, Eybens; Kathy Barla; Bernard Vuillermoz, both of Grenoble, all of France

[73] Assignee: France Telecom, France

[21] Appl. No.: 832,078

[22] Filed: Feb. 6, 1992

[30] Foreign Application Priority Data

Feb. 7, 1991 [FR] France .................. 91 01381

[51] Int. Cl.$^5$ .......................................... H01L 21/76
[52] U.S. Cl. ........................................ 437/69; 437/61; 437/67; 437/70; 437/72; 437/73; 148/DIG. 50
[58] Field of Search .............. 437/61, 67, 69, 70, 437/72, 73; 148/DIG. 50

[56] References Cited

U.S. PATENT DOCUMENTS

| | | | |
|---|---|---|---|
| 3,958,040 | 5/1976 | Webb | 156/17 |
| 4,533,429 | 8/1985 | Josquin | 437/69 |
| 4,563,227 | 1/1986 | Sakai et al. | 437/69 |
| 4,986,879 | 1/1991 | Lee | 437/69 |

FOREIGN PATENT DOCUMENTS

| | | | |
|---|---|---|---|
| 52948 | 6/1982 | European Pat. Off. | |
| 3418638 | 11/1984 | Fed. Rep. of Germany | 437/69 |
| 0169935 | 10/1983 | Japan | 437/69 |
| 8810510 | 12/1988 | PCT Int'l Appl. | |
| 1437112 | 5/1976 | United Kingdom | 437/69 |

OTHER PUBLICATIONS

V. K. Dwivedi, "A Bird's-Beak-free Sealed-Interface Local Oxidation Technology for Submicron Ultra-Large-Scale Integrated Circuits", Journal of Electrochemical Society, vol. 137, No. 8, pp. 2586-2588, Aug. 1990.
K. Tsukamoto et al., "Peripheral Capacitor Cell with Fully Recessed Isolation for Megabit DRAM", Japanese Journal of Applied Physics, Supplements, pp. 295-298, Aug. 1986.
Dave Bursky, "CMOS Process Breaks Bird's Beak Barrier", Electronic Design, vol. 37, No. 24, Nov. 1989.
Kuang Yi Chiu et al., "A Bird's Beak Free Local Oxidation Technology Feasible for VLSI Circuit's Fabrication", IEEE Transactions on Electron Devices, vol. ED-29, No. 4, pp. 536-540, Apr. 1982.
S. S. Lee et al., "A Novel CMOS Isolation Technology Using a Consumable Nitride Seal During Field Oxidation", Extended Abstracts, Spring Meeting Montreal, vol. 90-1, pp. 616-617, May 1990.
Russel Martin, "Spacer for Improved Local Oxidation Profile", Xerox Disclosure Journal, vol. 12, No. 5, pp. 251-253, Sep. 1987.

Primary Examiner—Brian E. Hearn
Assistant Examiner—Trung Dang
Attorney, Agent, or Firm—Larson and Taylor

[57] ABSTRACT

The invention relates to a process for buried localized oxidation of a silicon substrate. The process consists in performing a) a sealing on the surface of the substrate (S), by a first nitriding, by growing a later of silicon nitride forming at least one surface layer, then in performing b) the etching (G1) of a trench (T) intended to receive the buried localized oxidation. A second nitriding is performed c) on the free area of the trench (T) in order to obtain a sealing sc of the walls of the trench (T). An etching (G2) is performed at d) on the bottom wall of the trench (T) by at least partial etching of the silicon nitride layer obtained by second nitriding in order to uncover the substrate material (S). A localized oxidation e) is performed to produce the buried oxidation (OE) of the substrate in the trench. Application to the production of integrated circuits.

8 Claims, 5 Drawing Sheets

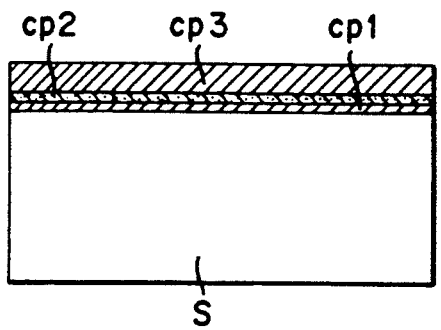
FIG. 2(a)
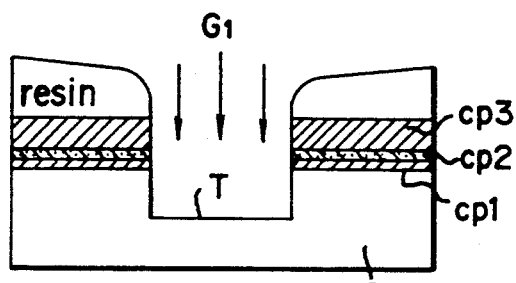
FIG. 2(b)
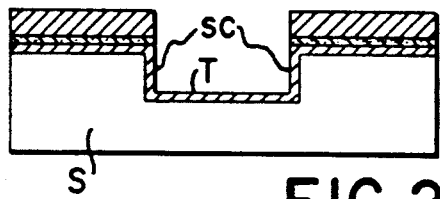
FIG. 2(c)
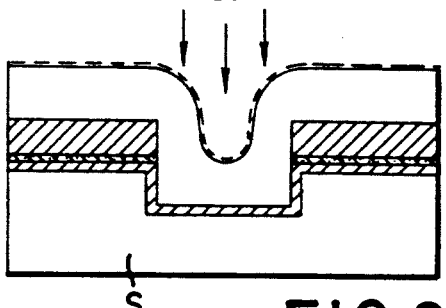
FIG. 2(c')
FIG. 2(c")
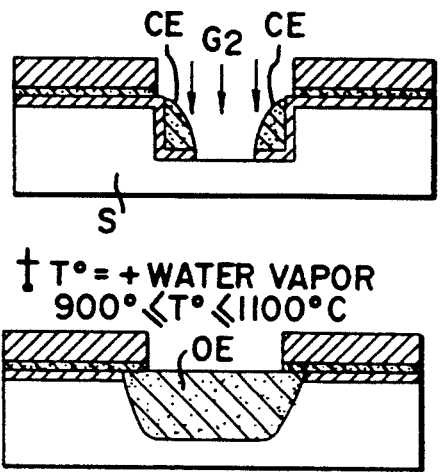
FIG. 2(d)
T° = + WATER VAPOR
900° ≤ T° ≤ 1100°C
FIG. 2(e)
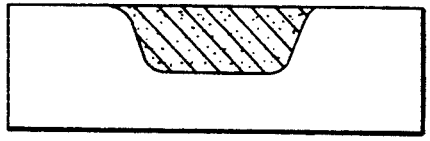
FIG. 2(o)

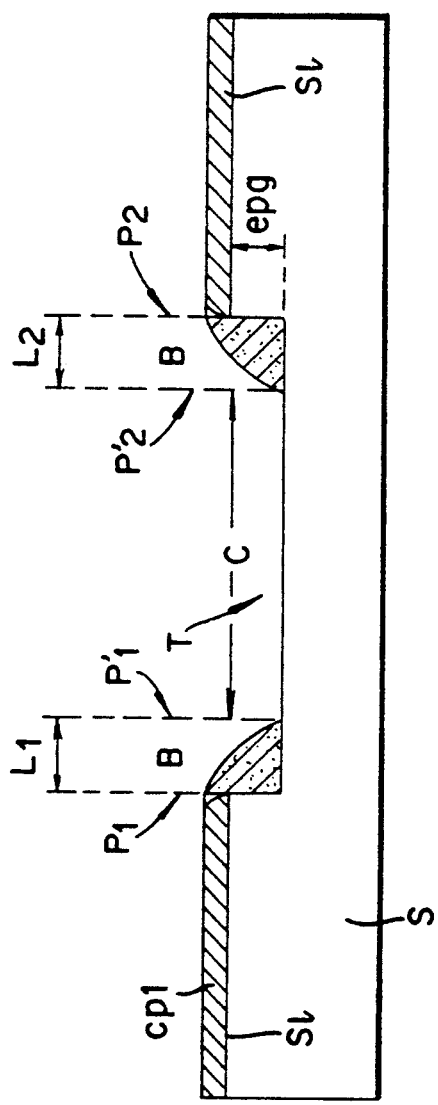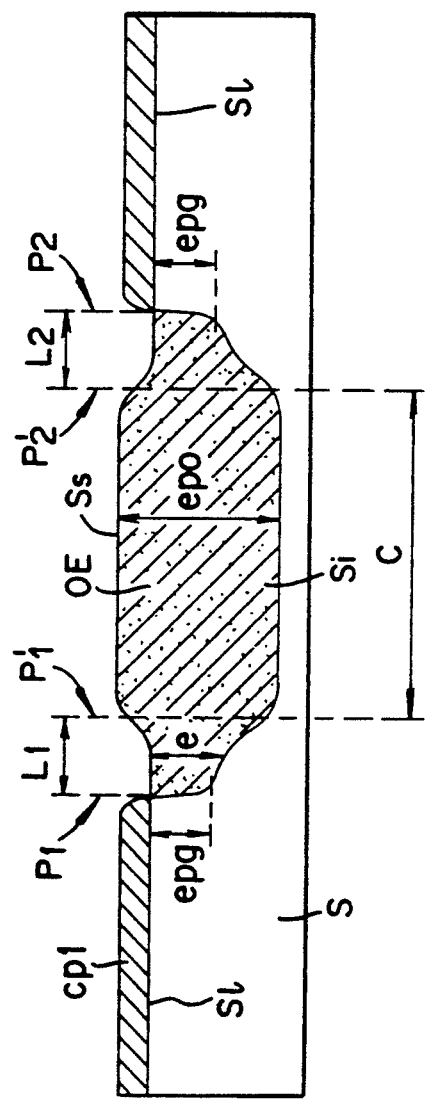

PROCESS FOR BURIED LOCALIZED OXIDATION OF A SILICON SUBSTRATE AND CORRESPONDING INTEGRATED CIRCUIT

The invention, relates to a process for buried localized oxidation of a silicon substrate and to the corresponding integrated circuit.

In the technical field of the manufacture of integrated circuits it is necessary to prevent the oxidation of silicon in active regions reserved for the manufacture of devices such as transistors. The most widely employed process is the LOCOS process, which in English stands for "LOCalized Oxidation of Silicon". The most efficient masking material is silicon nitride $Si_3N_4$. The material is usually deposited chemically in vapor phase (C.V.D.). However, such a deposition cannot be performed directly on the silicon substrate because of the differences in the values of the expansion coefficients of these materials and it is therefore necessary to employ an intermediate layer of silicon dioxide $SiO_2$, which is used as a buffer between the silicon nitride layer and the silicon substrate.

However, the introduction of this silicon oxide layer, produced by oxidizing the surface of the substrate, and generally called pedestal oxide, presents a considerable disadvantage when the integration dimensions of the circuit approach micron or submicron values.

This layer, in fact, constitutes a route of entry of the oxide under the mask, and this causes the fault referred to as a "bird's beak". Such a fault reduces the usable active area; it constitutes one of the major limitations to the increase in the integration density.

Various solutions have been proposed. Among these there may be mentioned the SILO (Sealed Interface Localized Oxidation) process, which consists in inserting a layer of silicon nitride between the pedestal oxide and the silicon substrate. The nitriding of the silicon can be carried out by means of a nitrogen plasma and normally makes it possible to avoid the appearance of the "bird's beak".

Since the abovementioned LOCOS and SILO processes remain oxidation processes of the semiburied type, the substrates exhibit a difference in level between the surfaces of the active regions and of the localized oxide, such a difference in level being prejudicial to the interconnecting line passages. In addition, the structures obtained by using these processes exhibit limited electrical insulation properties because the oxide enters the silicon only over half the thickness of the oxide.

In the case of a process of buried LOCOS type, other problems are still encountered. As a general rule, in a process of this type, starting with the opening of the nitride layer on the pedestal oxide, etching of the silicon is carried out to a depth close to half the thickness of the desired final oxide. This trench is then oxidized by traditional thermal processes. When the oxidation of the silicon areas situated inside the trench is performed, the following problems appear, as shown in FIG. 1a). The oxide area develops a bulge called a "bird's head" (1), which extends beyond the area of the active regions of the silicon. Such a bulge constitutes an obstacle to the passage of the interconnecting conductors, and discontinuities can prevent the flow of current. In addition, high mechanical stresses are developed, it being possible for these to give rise to defects (2) in the crystalline structure of the substrate, with the appearance of impairment in the conductive qualities of the silicon or the appearance of leakage currents at the junctions. During the oxidation a side oxidation is produced, comparable to that mentioned in relation to the semiburied LOCOS process, and this causes the appearance of the fault referred to as a "bird's beak" (3). Such a fault causes a deterioration in size relative to the dimensions drawn by photoengraving, which can be up to 0.5 μm. Thus, conductive capacities of an MOS transistor 1 μm in width can be halved, because of the existence of this fault.

As has been shown diagrammatically in FIG. 1b), when an oxide is grown by reacting silicon with an oxidizing species, for example water vapor, the volume occupied by the resulting oxide is double that of the silicon involved in this growth and the free space inside the trench is insufficient to ensure a corresponding expansion of the oxide thus formed. Thus, a first and a second oxidation front meet each other, these fronts being due to the oxidation of the bottom and of the wall of the trench respectively. Such a phenomenon is the cause of the first and of the second problem referred to above. In fact, in the region situated at the edge of a mask, the travel of the excess mass of oxide takes place by creeping of the oxide in a slow motion, and the rate of growth of the oxide, which is faster, results in the creation of compressive stresses in this region. These stresses are transmitted to the silicon substrate, which absorbs them, creating defects in its crystalline structure. In so far as the third problem mentioned above is concerned, the formation of the "bird's beak" is due to the diffusion of the oxidizing species in the pedestal oxide, which causes the oxidation of the silicon surface under the mask. The presence of this "bird's beak" in the buried LOCOS, as in the case of the semiburied LOCOS, is a cause which is additional to the excess oxide formation at the edge of the mask and thus contributes to the formation of the "bird's head".

Among the solutions proposed in order to remedy the abovementioned disadvantages there may be mentioned a process known by the name of SWAMI process, consisting in depositing a second silicon nitride layer aimed at protecting the wall against oxidation. In addition, the nitride layer prevents the diffusion of the oxidizing species into the pedestal oxide.

However, the application of this process has shown the existence of a high density of defects in the active regions, because of stresses developed by the excessively large thickness of the second nitride layer. This layer, which is deposited chemically in a vapor phase, cannot be less than 10 nm. This process can be improved by interposing a layer of pedestal oxide between the second nitride layer and the silicon wall; however, this reduces the efficiency of the marking or sealing by the second nitride layer, as the layer of pedestal oxide intensifies the progress of the oxidation under the mask. Similarly, this defect in the wall sealing also exists in the absence of pedestal oxide because the natural oxide which is always present on the silicon wall prevents a good contact between the nitride and the silicon and forms a route of entry of the oxidizing species. Another difficulty in applying this process lies in the fact that, after localized oxidation, it is necessary to remove the unoxidized part of the nitride layer. The residues to be removed, consisting of a mixture of oxide and nitride, form oxinitrides and are difficult to etch selectively without damaging the buried oxide.

Corresponding work has been described more recently, especially in patent application No. EP 284,456, in which a process is described, silicon nitride layers being employed to provide the sealing of trenches, these layers being produced by thick layers deposited chemically in a vapor phase. However, such a process does not make it possible to seal suitably the interface of the trench because of the presence of the natural oxide which is unavoidably present at the silicon surface, this technique being incapable of depositing very thin layers. The problem of the removal by etching of the nitride residues which are not consumed during the localized oxidation is not solved by the application of this process.

The process for buried localized oxidation of a silicon substrate forming the subject of the present invention is aimed at remedying the abovementioned disadvantages.

It is noteworthy in that it consists, successively, in performing a sealing on the free area of the substrate, by a first nitriding, by growing a layer of silicon nitride forming at least one surface layer in order to ensure the sealing of this free area, forming a horizontal interface. Following an appropriate masking stage, etching of a trench is performed into the silicon substrate and the nitride layer, this trench being intended to receive the buried localized oxidation. Sealing of the walls of the trench is performed by a second nitriding of the free area of the trench, by growing a second silicon nitride layer. An at least partial etching of the silicon nitride layer obtained by the second nitriding is performed on the bottom wall of the trench, in order to uncover the silicon substrate material. A localized oxidation of this material is performed to produce the buried oxidation of the substrate in the trench.

The process forming the subject of the invention finds application in the manufacture of integrated circuits in side-insulation techniques.

BRIEF DESCRIPTION OF DRAWING

The process forming the subject of the invention will be understood better on reading the description and inspecting the drawings hereinafter, in which, in addition to FIGS. 1a and 1b which, relate to the prior art:

FIGS. 2a-2e and 20 show, by way of a nonlimiting example, a first embodiment of the process forming subject of the invention;

FIGS. 3a-3l and 30 show, by way of a nonlimiting example, a second embodiment of the process forming the subject of the invention;

FIG. 5a shows a dimensioned view of a silicon substrate S subjected to the process forming the subject of the present invention and corresponding to stage d) of FIG. 2;.

FIG. 5b shows in section, in the same section plane as that of FIG. 5a, a dimensioned view of an integrated circuit forming the subject of the invention, comprising a buried oxide region produced by the process of the invention.

Figure 1A:
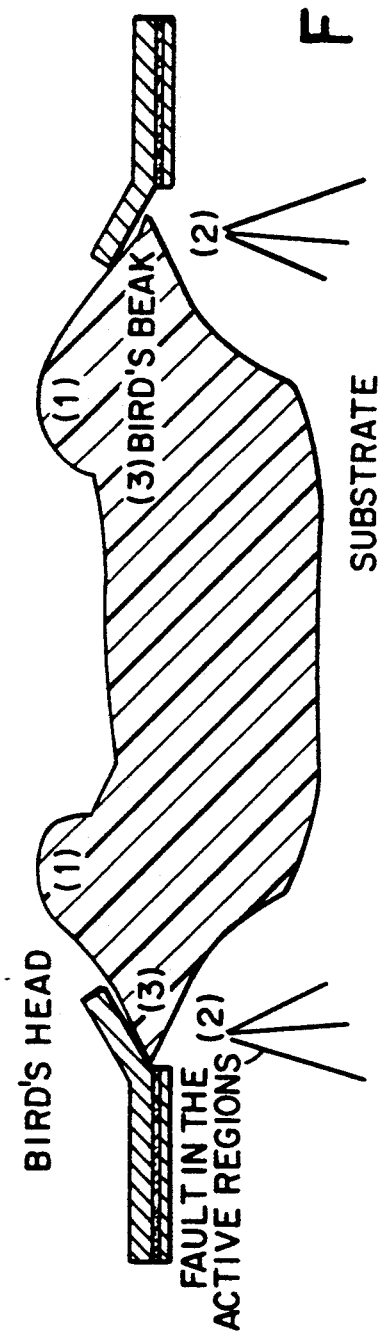
Figure 1B:
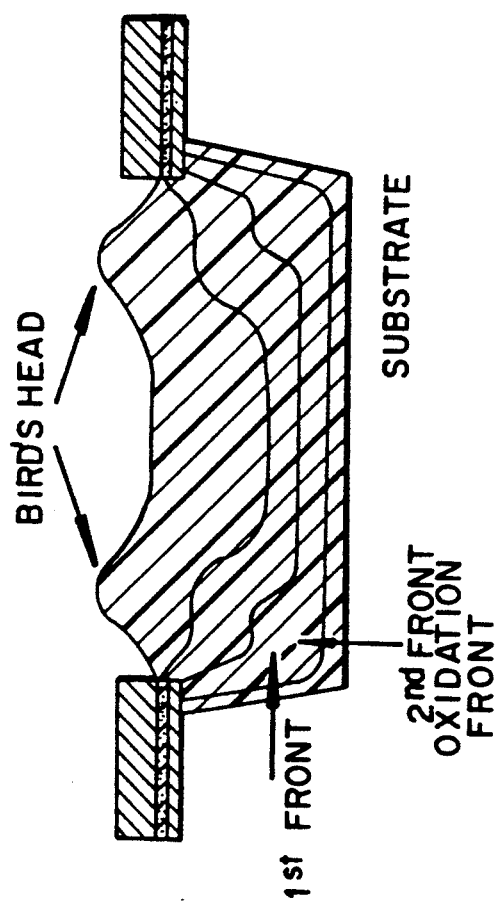
Figure 3A:
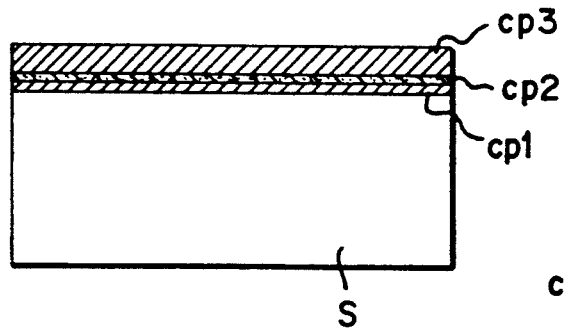
Figure 3D:
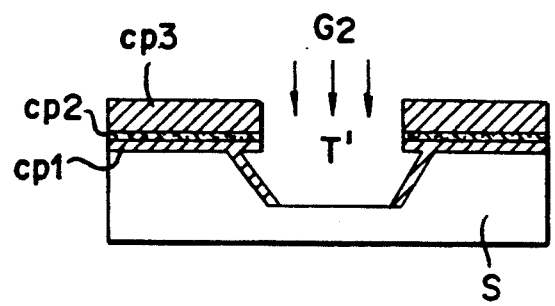
Figure 3B:
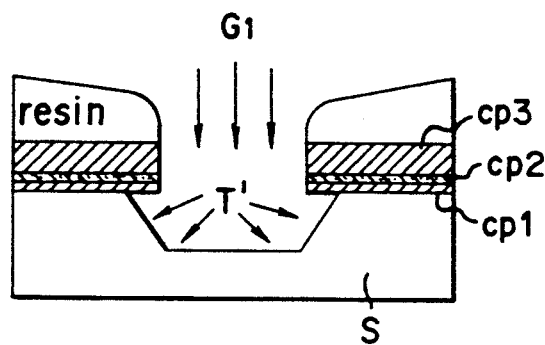
Figure 3E:
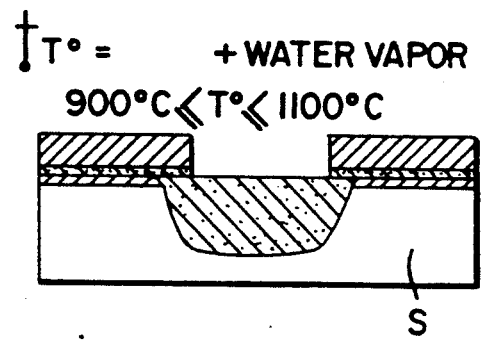
Figure 3C:
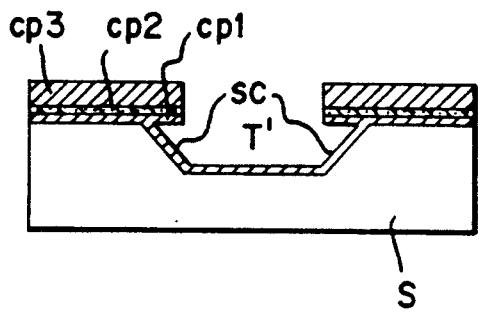
Figure 3O:
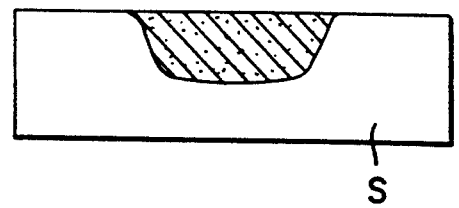

A more detailed description of the process for buried localized oxidation of a silicon substrate forming the subject of the present invention will be given in conjunction with FIG. 2.

As shown in this figure, the process forming the subject of the present invention consists successively in performing, on the free area of the silicon substrate, marked S, a sealing of this area by growing a layer of silicon nitride forming at least one surface layer.

Different surface layers, marked cp1, cp2 and cp3 have been shown at point a) of FIG. 2.

The layers cp1, cp2 and cp3 are intended to produce the sealing of the free area of the silicon substrate S, this free area forming a horizontal interface.

Advantageously, the first surface layer cp1 is formed by a first nitriding by controlled growth, especially with regard to temperature and in the presence of ammonia, of a layer of silicon nitride on the free area of the substrate S, this layer obtained by diffusion of nitrogenous species originating from a reactive atmosphere into the surface layers of silicon being a thin layer whose thickness does not exceed 5 nm.

Obviously, the silicon substrate S is placed for this purpose in an oven which optionally makes it possible to create an ammonia plasma and is subjected to the conventional treatment operations using an oven of this type, which will not be described in detail, since these operations respond to operations of a conventional type.

Layer cp2 is advantageously a layer of pedestal material such as, for example, silicon oxide $SiO_2$ or of polycrystalline silicon, it being possible for this layer to be deposited chemically in a vapor phase, optionally, for example, plasma-assisted, such a layer being deposited over a thickness of 10 to 25 nm.

Finally, the surface layer cp3 is a silicon nitride layer deposited as a thick layer by a chemical process in a vapor phase, for example over a thickness of 20 nm to 100 nm.

It will thus be understood that, in the case of the free area of the substrate S, the layers cp1, cp2 and cp3 form a particularly effective seal enabling the process according to the invention to continue to be applied.

This latter process next consists, as shown particularly at point b) of FIG. 2, in performing, following an appropriate masking stage, an etching marked G1 into the silicon substrate S and into the silicon nitride layer obtained by first nitriding in particular, in order to form a trench T intended to receive the buried localized oxidation.

At the point b) of FIG. 2, the etching G1 is symbolized by arrows. It will be understood, of course, that, prior to the actual etching process, a process of masking by means of a resin has been suitably performed in order to represent, on the free area of the substrate S and, in particular, on the layers cp1, cp2 and cp3, forming the sealing, the two-dimensional shape of the trench T in which the buried oxide layer will be developed during the subsequent application of the process.

Without any limitation being intended, the etching G1 is performed by an anisotropic process using an adapted reactive ion etching to a depth of the order of a few hundred nm, counting from the substrate S/layer cp1 interface, for example.

Following the stage shown at point b) of FIG. 2, the process forming the subject of the present invention consists, after removal of the resin forming the etching mask, in performing, as shown at point c) of this same FIG. 2, a second nitriding on the free area of the trench T, to produce a sealing, marked sc, by growing a silicon nitride layer on the walls of the trench T.

This second nitriding can be advantageously performed by a treatment of the substrate S comprising the trench T under conditions which are similar to those needed to apply the first nitriding. In particular, the thickness of the silicon nitride layer producing the sealing sc is of the order of 5 nm.

The process forming the subject of the present invention can then consist, as shown at point d) of FIG. 2, in performing an etching marked G2 on the bottom wall of the trench T, or at least a part of the surface of this bottom wall, of the silicon nitride layer obtained by the second nitriding described above, in order to uncover the of the material silicon substrate.

The abovementioned etching G2 is also symbolized by vertical arrows in the same way as etching G1, it being advantageously possible for both these etchings to be carried out by means of adapted reactive ion etching processes generating an anisotropic etching of the silicon substrate. A more detailed process of etching of the bottom wall of the trench and, in particular, of the sealing sc on this wall will be described later in the description.

The process forming the subject of the present invention, as shown in FIG. 2, finally consists in performing, as shown at point 2 of this same figure, a localized oxidation of the material, that is to say of the silicon laid bare at the bottom of trench T, to perform the buried oxidation—marked OE—of the substrate in the trench T.

For this purpose, the substrate, as obtained above at the end of the stage of the process as shown at point d) of FIG. 2, is then placed in an oven in a moist atmosphere, the temperature of which is, for example, between 900° C. and 1100° C.

At point o) of FIG. 2 the substrate obtained after growth of the buried oxide layer OE has been shown, the surface layers cp1, cp2 and cp3 having been removed, for example by selective etching.

It will be noted, of course, that during the application of the process as described above in conjunction with FIG. 2, the depth of the trench T and the thickness of the localized oxide OE determines, in fact, the difference in alignment between the free area of the buried oxide OE and that of the silicon substrate S.

In any event, the free area of the buried silicon oxide layer OE is substantially planar and parallel to that of the silicon substrate S after the layers cp1, cp2 and cp3 have been removed.

It will be noted that in the embodiment of the process forming the subject of the invention, as shown in FIG. 2, the etching G1 which allows the trench T to be produced is carried out by an anisotropic etching process so that the trench T has substantially vertical side walls which are at right angles to the bottom wall of the trench.

In such a case, and in order to facilitate the application of stage d) of the process forming the subject of the invention and, in particular, of the process of etching G2 of the sealing layer sc at the bottom of the trench, the process forming the subject of the present invention may additionally consist in depositing, as shown at c'), a thick layer CE of silicon oxide, shown using broken lines, covering the layer cp3 and the walls and bottoms of the trench, before the stage d) consisting in performing an at least partial etching of the silicon nitride layer obtained by second nitriding.

A partial etching, marked G'1, of the thick silicon oxide layer CE is then performed to uncover part of the silicon nitride layer obtained on the bottom wall of the trench T by applying the second nitriding at the preceding stage c) of application of the process according to the invention. The partial etching G'1 is preferably performed by anisotropic etching, symbolized by vertical arrows, and has the effect of maintaining, in the vicinity of the side walls of the trench T, a bead of oxide B protecting the silicon nitride layer obtained by the second nitriding. The result of the etching G'1 is shown in c'') of FIG. 2. In particular, this protective bead B ensures the protection, during the etching G2, of the seal sc, on the one hand, on the vertical walls of the trench T and, on the other hand, on at least a part of the bottom wall of this same sealing layer sc.

However, the application of such a process requires the additional stage c') of FIG. 2, which can be dispensed with by applying the process forming the subject of the invention in a second alternative form of embodiment, such an alternative form being now described in conjunction with FIG. 3.

In the second alternative form of embodiment as shown in the abovementioned figure the points a), b), c), d) and e) correspond substantially to the points bearing the same references in FIG. 2.

However, as can be noted by inspecting FIG. 3, the process of etching of the trench as shown at point b) of FIG. 3 is carried out by a semiisotropic etching so as to form a trench T' which has side walls which are substantially oblique relative to the bottom wall of the trench.

The semiisotropic etching G1 at point b) of FIG. 3 has been shown symbolically by vertical arrows extended by arrows forming a circular arc.

Obviously, the etching of the silicon substrate in the form of semiisotropic etching is performed by means of a liquid chemical etching process or an adapted reactive ion etching process.

As can be noted by inspecting FIG. 3, the surface layer(s) cp1, cp2 and cp3 form an overhang in relation to the oblique side walls of the trench T', this overhang having the effect of protecting from the etching the parts of the silicon nitride layer forming the sealing sc—a layer obtained by second nitriding—which are situated on the abovementioned oblique side walls and under this overhang.

In this case, and identically with the first embodiment shown in FIG. 2, the etching G2 is performed by an anisotropic etching so as to etch substantially solely the bottom wall of the trench T' in order to remove the sealing sc on this bottom wall.

In the same way as in the first embodiment shown in FIG. 2, the substrate is then subjected, at point e) of FIG. 3, to a localized oxidation of the material to produce the buried oxidation, this oxidation being performed by thermal oxidation in a moist atmosphere.

Lastly, the silicon substrate S provided with its buried oxide layer OE after removal of the layers cp1, cp2 and cp3 has been shown at point o) of FIG. 3.

Figure 4A:
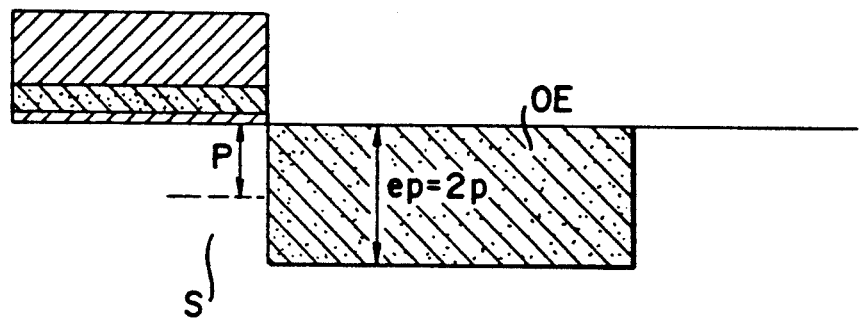
FIGS. 4a and 4b show a sectional view of a silicon wafer comprising a completely or partially buried localized oxidation in accordance with the subject of the invention.
Figure 4B:
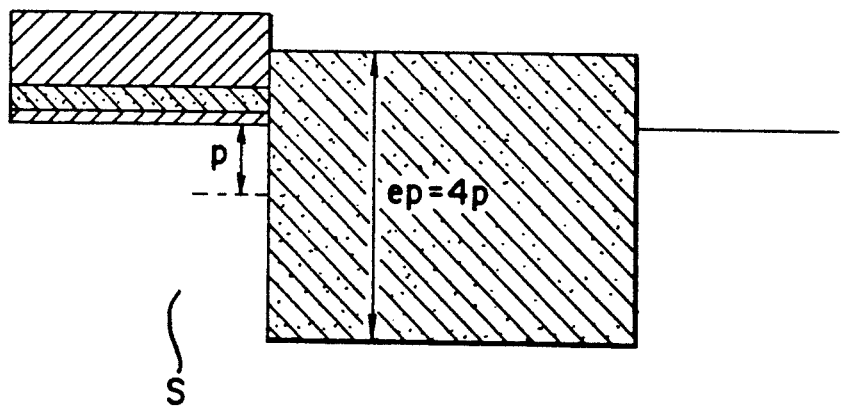

FIGS. 4a and 4b show, furthermore, a silicon wafer S comprising at least one buried silicon oxide layer OE before removal of the layers cp1, cp2 and cp3.

According to an advantageous characteristic of the wafer thus obtained, this oxide layer comprises a free area, planar and parallel to the free area of the substrate. It can be seen that the free area of the oxide may be situated above or below the free area of silicon, depending on the depth p of the trench produced and depending on the thickness of the buried oxide OE produced. FIG. 4a shows the case where ep is twice p and FIG. 4b the case where ep is equal to four times p.

A more detailed description of an integrated circuit in accordance with the subject of the invention and exhibiting a buried oxide region produced by the process forming the subject of the invention will be given in conjunction with FIGS. 5a and 5b.

FIG. 5a shows a dimensioned view of a silicon substrate S subjected to the process forming the subject of the invention and corresponding to stage d) of FIG. 2, that is after the etching stage G2. After this stage the trench T defined by the planes p1 and p2, which are transverse to the free area S1 of the silicon substrate S comprises a central region C between the planes p'1 and p'2 defined by the silicon oxide beads B.

By way of nonlimiting example, the dimensions below are given purely for the purpose of illustration. p1p2=1.6 μm, p1p'1=p2p'2=0.25 μm, epg=0.05 to 0.5 μm; epg denoting the depth of etching of the trench T relative to the free area S1 of the substrate S.

FIG. 5b, on the other hand, shows a view in section in the same section plane as that of FIG. 5a, a dimensioned view of an integrated circuit forming the subject of the invention, comprising a buried oxide region produced by the process of the invention. As shown in the abovementioned figure, the substrate S comprises at least one buried oxide region OE in the trench T, which is defined by planes p1 and p2, transverse to the free area S1 of the substrate. The buried oxide region OE has a uniform thickness epo over the central region C between an upper surface Ss and a lower surface Si which are planar and parallel to the free area S1 of the silicon substrate S. It will be noted that the central part C corresponds to the bottom area of the trench where the second nitride layer has been etched.

In addition and according to a particularly advantageous characteristic of the integrated circuit according to the invention, as shown in FIG. 5b, the buried oxide region OE has, in the side regions 11, 12 included between the central region C and the planes p1, p2 defining the trench T, that is between the planes p1, p'1 and p2, p'2 respectively, a thickness e which varies monotonically between the value of the thickness of the oxide buried in the central region epo and a thickness value epg, the depth of etching of the trench T into the silicon substrate S. Because of the fact that epg≦epo and bearing in mind the monotonic variation of the thickness e of the oxide buried in the abovementioned side regions, it will be understood that the buried oxide layer OE in the vicinity of the edge of the trench T, that is to say in the abovementioned side regions L1, L2, is free from any bird's head.

By way of a purely illustrative example, the dimension of the thickness of buried oxide in the central region C is taken to be equal to epo=0.55 μm.

Finally, in the embodiment described in conjunction with FIG. 5b, the planes p1 and p2, and consequently p'1 and p'2, are substantially at right angles to the free area S1 of the silicon substrate S. When FIG. 5b is inspected, in the vicinity to the right of plane p1, the buried oxide region OE at the interface with the substrate S at the height of the planes p1, p2 exhibits a thickness equal to epg, the depth of etching of the trench T and, correspondingly, in the vicinity to the left of the same plane p1 and in particular under the mask cp1, a thickness which is substantially zero in the absence of any entry of oxide between the mask and the free area of the substrate, and conversely with regard to the right and left vicinities of the plane p2. Bearing in mind the characteristics of the interfaces of the buried oxide OE with the silicon substrate S, it will be understood that the buried oxide region(s) OE are also free from any bird's beak.

A particularly advantageous process for buried localized oxidation of a silicon substrate has thus been described.

In fact, the nitriding process performed by a controlled reactive growth of the corresponding nitride layer, to perform the sealing sc of the walls of the trench T or T', is such that the nitride layer growing from the silicon surfaces is sufficiently effective to prevent the oxidation of the corresponding silicon surfaces and sufficiently thin—thinner or equal to 5 nm—to prevent the creation of mechanical stresses in the underlying silicon.

It will additionally be noted that by adjusting the thickness of silicon nitride relative to the final thickness of the buried oxide it is furthermore possible to obtain a progressive oxidation of the silicon nitride layer, which leaves no residue at the edge of a mask of the buried structure (cf. FIG. 4a).

In order to produce the sealing layers obtained by first and second nitriding it is possible, for example, to employ the plasma-assisted nitriding process as described in French Patent Application No. 83/18,299 of Nov. 17, 1983.

Laboratory tests have shown, in fact, that a silicon wafer covered with a 5-nm nitride layer produced according to the abovementioned process is capable of withstanding oxidation in water vapor for an hour and a half, whereas a virgin silicon wafer placed under the same conditions is oxidized over a thickness of more than 300 nm.

It will be noted, furthermore, that during an exposure of the sealing layers sc for a period longer than the abovementioned time, these are completely converted into oxide.

In addition, the nitriding of silicon by a growth method such as plasma-assisted nitriding makes it possible to obtain highly saturated growth kinetics which permit easy control of the final nitride thickness between 2 and 6 nm to form the sealing layer sc. It is therefore also possible to adjust without any difficulty the nitride thickness required as a function of the desired final thickness of the buried oxide.

In addition, similarly to all the growth methods, the plasma-assisted nitriding process gives rise to an isotropic growth of the nitride layer whatever the geometry of the areas to be nitrided. It is therefore also possible to nitride in a uniform manner the silicon areas of the active regions and those corresponding to the trench walls. In addition, the natural oxide present at the surface of the walls which are subjected to the abovementioned nitriding process is removed as early as in the first stages of the nitriding.

Such a property ensures the reproducibility of the process forming the subject of the present invention, because the natural oxide can differ from one silicon wafer to the next.

Thus, the sealing obtained is of a very high quality, the thin nitride layer obtained by the first and second nitriding being perfectly adherent to the silicon and prevents the side oxidation both under the sealing layer sc and under the thin nitride layer indicated by cp1 previously in the description, between the pedestal oxide cp2 and the free area of the silicon substrate. The oxidation of the wall of the trenches T or T' is prevented, thus limiting the production of excess oxide and therefore preventing the formation of the bird's head.

The side oxidation under the mask, that is to say, in fact, under the surface layers cp1, cp2 and cp3, is prevented and there is therefore no formation of any bird's beak.

This latter characteristic also appears to be very important because, in a buried structure, the bird's beak also contributes to the formation of the bulge forming the bird's head. In fact, it has been shown that merely nitriding the wall of the trench T or T' was insufficient to eliminate the abovementioned bulge completely.

It is therefore by performing a continuous and isotropic sealing of the horizontal areas, free areas of the silicon substrate S, and of the vertical and/or oblique ones, that it is possible to succeed in obtaining a buried oxide layer OE which is perfectly uniform and aligned with the horizontal area of the active regions.

What is claimed is:

1. A process for buried localized oxidation of a silicon substrate, which consists, successively:
   in performing a) a sealing on the free area of the said substrate, by a first nitriding, by controlled growth of a layer of silicon nitride forming at least one surface layer in order to ensure the sealing of said free area, forming a horizontal interface, this surface layer being obtained by diffusion of nitrogenous species from a reactive atmosphere into the surface layers of silicon and having a thickness not exceeding 5 nm,
   in performing b), following an appropriate masking stage, the etching into said silicon substrate and said silicon nitride layer, of a trench intended to receive said buried localized oxidation, the depth of the trench and the thickness of the localized oxide determining the difference in alignment between the free area of the buried oxide and that of the silicon substrate,
   in performing c) on the free area of said trench, by a second nitriding, a sealing by growing a silicon nitride layer in order to ensure the sealing of the walls of said trench,
   in performing d), on at least a part of the bottom surfaces of said trench, an etching of the silicon nitride layer obtained by said second nitriding, in order to uncover the material of said silicon substrate,
   in performing e) a localized oxidation of said material to produce the buried oxidation of said substrate in the trench.

2. The process as claimed in claim 1, wherein, following the stage consisting in performing said first nitriding and before the masking and trench-etching stage, said process consists:
   in depositing a protective layer of silicon oxide or of polycrystalline silicon on said silicon nitride layer obtained by the first nitriding,
   in depositing a thick layer of silicon nitride on said protective layer to form corresponding surface layers on the free area of the substrate.

3. The process as claimed in claim 1, wherein said process of etching of the trench is carried out by an anisotropic etching so as to form a trench which has substantially vertical side walls at right angles to the bottom wall of the trench.

4. The process as claimed in claim 3, wherein before the stage d) consisting in performing an at least partial etching of the silicon nitride layer obtained by second nitriding, said process consists:
   in depositing c') a thick layer of silicon oxide, so as to cover all the surfaces where silicon nitride layers obtained by said second nitriding are present,
   in performing a partial etching of said thick layer of silicon oxide to uncover said silicon nitride layer obtained over at least a part of the bottom surface of the trench by the second nitriding, said partial etching having the effect of maintaining, in the vicinity of said side walls of the trench, a bead locally protecting said silicon nitride layer obtained by the second nitriding.

5. The process as claimed in claim 1, wherein said process b) of etching of the trench is carried out by semiisotropic etching so as to form a trench with side walls which are substantially oblique relative to the bottom wall of the trench, the surface layer(s) forming, in relation to said oblique side walls, an overhang protecting from the etching the parts of the second thin nitride layer which are situated under this overhang.

6. The process as claimed in claim 1, wherein said etching, on at least a part of the bottom surface of said trench, of the silicon nitride layer obtained by the second nitriding is performed by an anisotropic etching.

7. The process as claimed in claim 1, wherein said localized oxidation e) of the material to produce the buried oxidation of the substrate in the trench is performed by thermal oxidation in a moist atmosphere.

8. The process as claimed in preceding claim 1, wherein said first and second nitriding are performed by nitriding under plasma.

* * * * *